(12) United States Patent
Trimberger

(10) Patent No.: US 7,365,568 B1
(45) Date of Patent: Apr. 29, 2008

(54) METHOD AND CIRCUIT FOR REDUCING PROGRAMMABLE LOGIC PIN COUNTS FOR LARGE SCALE LOGIC

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/699,114

(22) Filed: Jan. 29, 2007

Related U.S. Application Data

(62) Division of application No. 10/956,210, filed on Sep. 30, 2004, now Pat. No. 7,187,202.

(51) Int. Cl.
*H03K 19/177* (2006.01)
*H01L 25/00* (2006.01)
(52) U.S. Cl. ............................ 326/41; 326/47; 326/101
(58) Field of Classification Search ............ 326/37–39, 326/41, 47, 101; 361/761, 764
See application file for complete search history.

(56) References Cited

U.S. PATENT DOCUMENTS

| | | | |
|---|---|---|---|
| 6,472,903 B1 * | 10/2002 | Veenstra et al. | ............... 326/38 |
| 6,526,461 B1 | 2/2003 | Cliff | |
| 7,187,202 B1 | 3/2007 | Trimberger | |

OTHER PUBLICATIONS

Xilinx, Inc.; U.S. Appl. No. 10/956,235, by Trimberger filed Sep. 30, 2004.

* cited by examiner

*Primary Examiner*—Daniel Chang
(74) *Attorney, Agent, or Firm*—James Harrison

(57) ABSTRACT

A circuit board includes a large scale logic device and at least one outrigger device wherein signals having a transmission delay budget that exceed a threshold value are produced to the outrigger device for coupling to circuit devices of the circuit board that are external to the large scale logic device. One embodiment of the invention comprises a plurality of outrigger devices that communicate with the large scale logic device by way of parallel data buses, as well as multi-gigabit transceiver data lines. Logic within the outrigger devices is generally limited to signal routing and transmission logic. The large scale logic device further comprises logic to transmit and receive signals to and from the outrigger devices in a way that is transparent to internal logic of the large scale logic device.

8 Claims, 10 Drawing Sheets programmable logic with outrigger devices exemplary circuit board with large scale prior art programmable logic with corresponding breakout areas exemplary circuit board with large scale programmable logic with outrigger devices and corresponding breakout areas exemplary large scale programmable logic with outrigger device programmable logic with outrigger devices programmable logic device 10 programmable MGTs 14 - 28 exemplary exportation of communication logic
only for outrigger devices

METHOD AND CIRCUIT FOR REDUCING PROGRAMMABLE LOGIC PIN COUNTS FOR LARGE SCALE LOGIC

BACKGROUND OF THE INVENTION

1. Technical Field of the Invention

This invention relates generally to programmable logic systems and more particularly to pin arrangements for programmable logic systems.

2. Description of Related Art

Communication systems and other modern programmable logic systems are known to process and/or transport large amounts of data between a plurality of end circuit components, user devices, which, for example, include telephones, facsimile machines, computers, television sets, cellular telephones, personal digital assistants, etc. For example, a programmable logic device within a communication system may be required to produce significant amounts of data and control signals to a plurality of circuit elements to facilitate communications. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet whose function is largely to process or transceive large amounts of data. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, requires 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information.

As the demand for data throughput increases, so do the demands on high-speed serial transceivers, as well as corresponding processing logic. The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver may operate without excessive jitter performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for wide spread use.

As data processing requirements increase for any purpose including communications as described above, application specific integrated circuits (ASIC), programmable logic devices such as field programmable gate arrays (FPGAs) and other logic devices, are realizing substantial problems in connecting external devices to the specified logic devices. For example, some logic devices are now being manufactured with a pin count that approaches 1500. In the future, pin counts could easily double. Even with just 1000 pins, however, require a substantial "breakout" area to couple the pins to the external devices. As the pin counts increase, the required breakout area size increases leading to larger and more expensive boards.

What is needed, therefore, is an apparatus and method that provide reducing pin counts for a specified logic device to reduce the immediate breakout area size and to reduce overall board complexity, size and cost.

BRIEF SUMMARY OF THE INVENTION

The embodiments of the present invention provide a method and apparatus for reducing a number of pins that is required for a large scale logic device, reducing a corresponding breakout area, and potentially increasing a total number of pins that may be used to transmit and receive data from and to the large scale logic device. To achieve the aforementioned benefits, the various embodiments of the present invention include using one of a parallel data bus or a multi-gigabit transceiver data line to export pins from the large scale logic device to an external and separate device for providing additional I/O. Such a device is referenced herein as an outrigger device. Accordingly, a specified group of signals may be transmitted from or received through the outrigger devices, and more specifically, the exported pins of the outrigger devices rather than through local pins.

In one embodiment of the present invention, pins having a transmission delay budget that is less than a specified threshold are transmitted or received directly through local pins. A group of signals whose transmission delay budget exceeds the specified threshold are candidate signals for transmission from an exported pin on an outrigger device. In an embodiment having multiple outrigger devices and further utilizing both parallel data buses as well as multi-gigabit transceiver data lines, a second threshold is defined wherein signals having a transmission delay budget between the first and second thresholds may be produced to outrigger devices over the multi-gigabit transceiver lines, while signals having a transmission delay budget that exceed the second threshold value may be produced over the parallel data bus to a second group of outrigger devices.

DETAILED DESCRIPTION OF THE INVENTION

Figure 1:
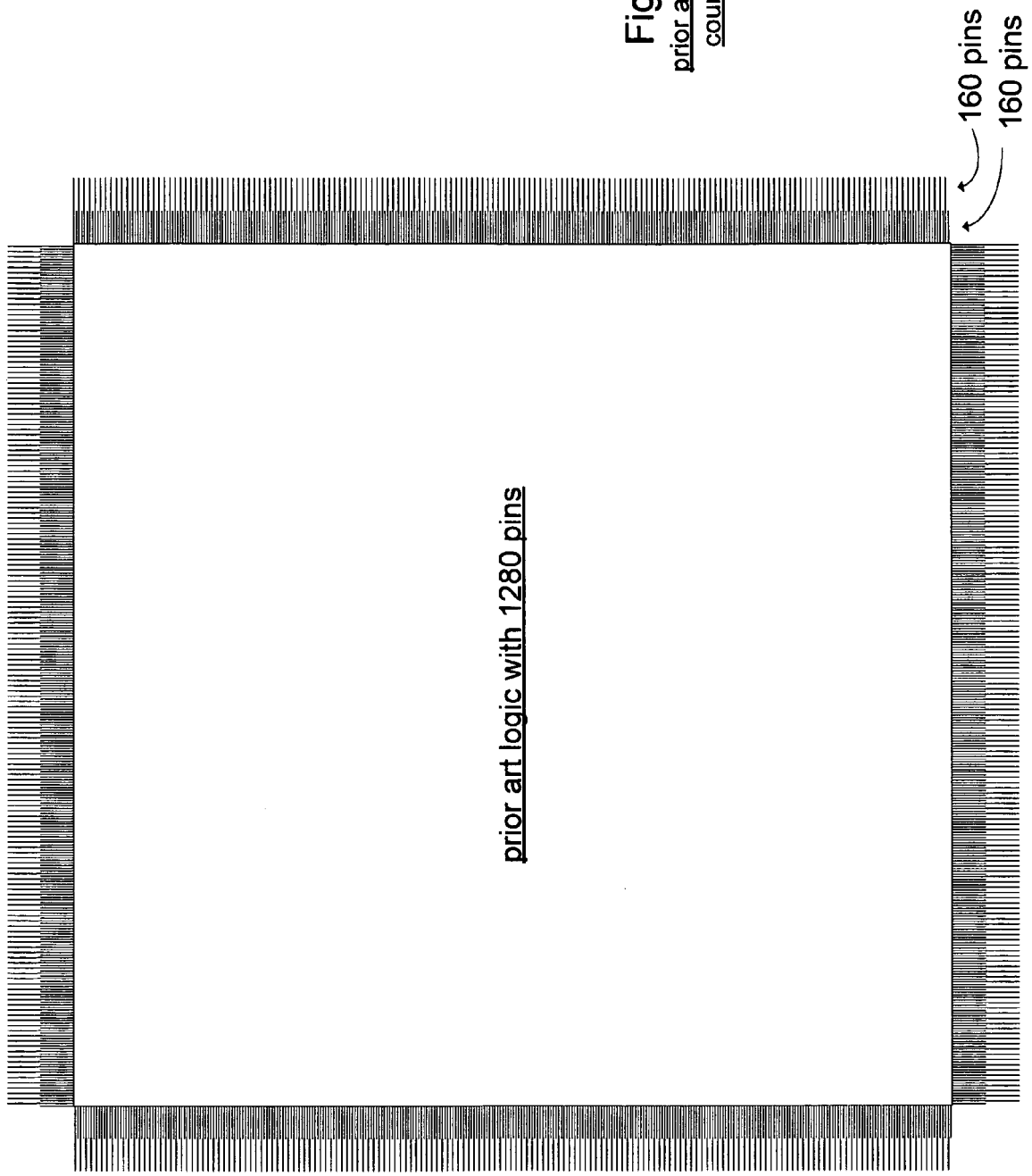
FIG. 1 is a functional schematic block diagram of a prior art logic device.

FIG. 1 is a functional schematic block diagram of a prior art logic device. As may be seen in FIG. 1, the exemplary logic device is formed with a pin count of 1280 pins. Generally, each side of the logic device includes 320 pins for coupling to external circuitry. As pin counts exceed a practical threshold amount, a breakout area for coupling the pins to circuitry, lead lines, etc., tends to increase in size. According to Rent's Rule named after E. F. Rent, the number of pins is a function of a proportionality constant times a number of logic gates raised to a constant (named Rent's Constant). Generally, an increase in logic gates results in a corresponding increase in the required number of pins as specified by Rent's formula. Thus, as the number of logic elements in a circuit block grow dramatically, the ability to access the device and all of the data and circuit inputs therein becomes a daunting task. It should be understood that FIG. 1 illustrates but one example of a configuration of a device with a large pin count. The problem noted here in reference to FIG. 1, however, is equally applicable to other configurations and technologies for coupling large scale devices including, for example, ball-grid array packaging.

Figure 2:
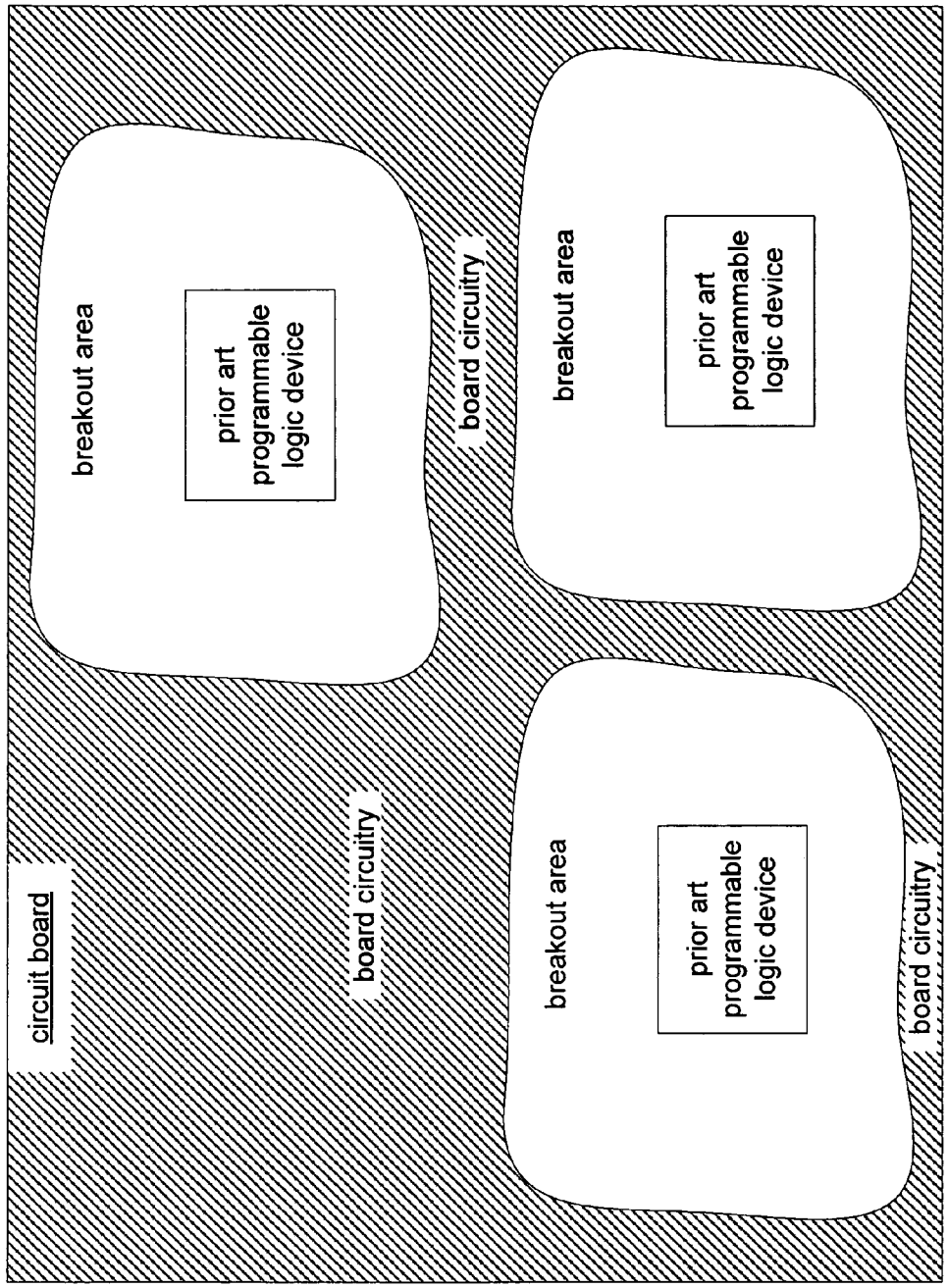
FIG. 2 is a prior art example of a printed circuit board and corresponding breakout areas.

For large scale devices, as shown in FIG. 2 which illustrates a circuit board with prior art large scale logic devices and corresponding breakout areas, a breakout area used to couple lead lines and circuit traces to the pins (or balls of a ball-grid array) may consume an area that is many multiples the area of the large scale logic device. The breakout area includes board area and additional board routing layers needed to connect internal package pins or balls to additional devices. The increased area and routing layers increase the cost of the wiring board. It is desirable, therefore, to find an escape from Rent's Rule for the particular large scale logic device having large numbers of pins by reducing the pin count from a pin count in the order of size specified by Rent's Rule.

Figure 3:
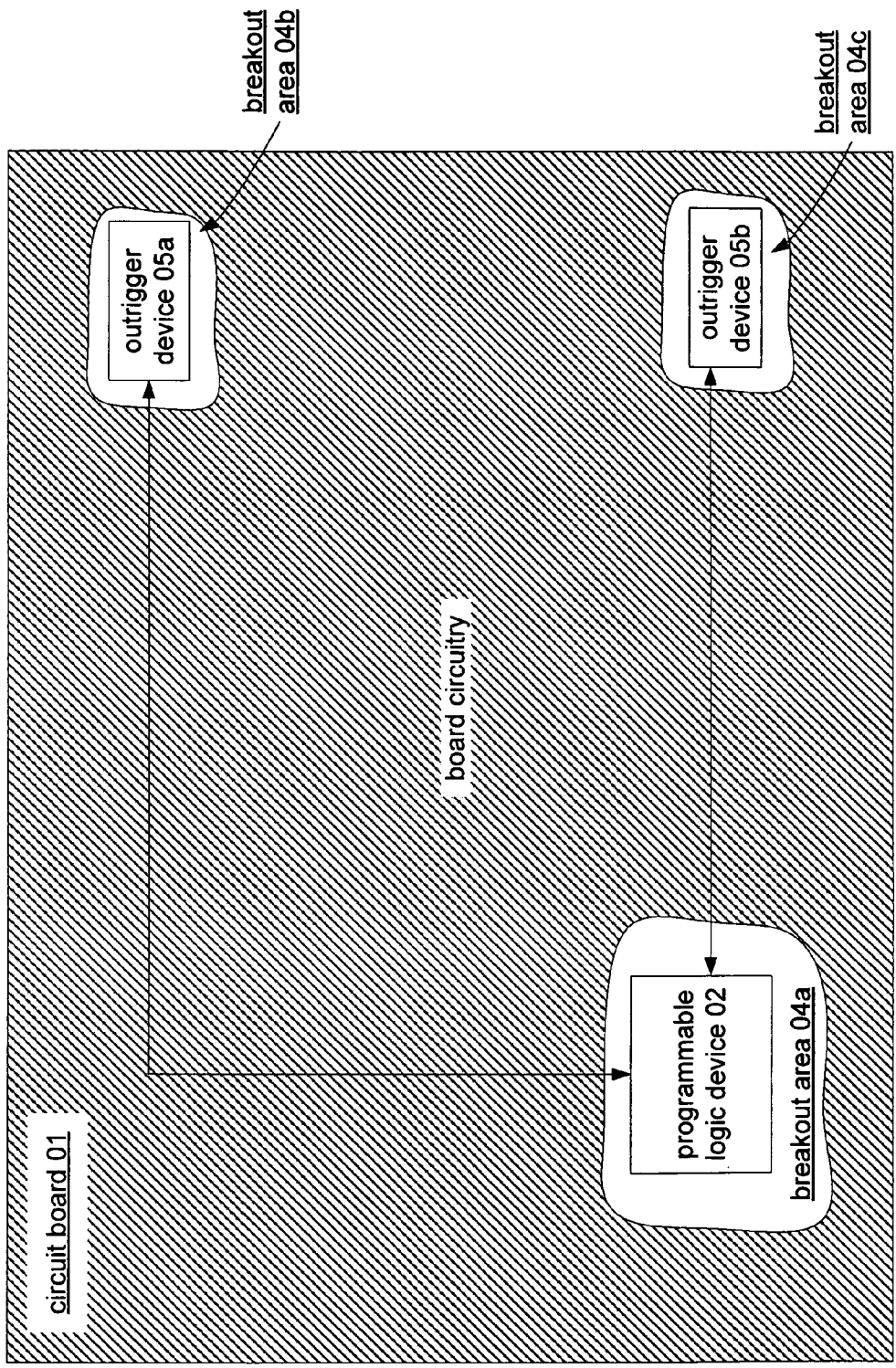
FIG. 3 is an exemplary circuit board with large scale programmable logic with outrigger devices and corresponding breakout areas according to one embodiment of the present invention.

FIG. 3 is an exemplary circuit board with large scale programmable logic with outrigger devices and corresponding breakout areas according to one embodiment of the present invention. As may be seen, a circuit board 01 includes a programmable logic device 02 that is surrounded by a breakout area 04a. Additionally, programmable logic device 02 is operatively coupled to communicate with outrigger devices 05a and 05b. Outrigger device 05a is surrounded by a corresponding breakout area 04b, while outrigger device 05b is surrounded by a corresponding breakout area 04c.

Contrasting the breakout areas 04a and the breakout area for a prior art programmable logic device, such as that shown in FIG. 2, it may be seen that a breakout area for the prior art programmable logic device may be multiple times larger in terms of surface area than the associated prior art programmable logic device while, as shown in FIG. 3, the breakout area is substantially smaller than a breakout area for the prior art device.

Generally, the breakout area refers to an area that is reserved for coupling board circuitry to pins of the particular logic device. The area may include additional wiring layers as well as the board area. Thus, as is shown in FIG. 2 for a prior art circuit board and programmable logic device, a greater area of the circuit board must be utilized in the prior art for coupling a programmable logic device having large numbers of semi-conductor logic elements there within that is required for the programmable logic device of FIG. 3. As should be noted, outrigger devices 05a and 05b further include associated breakout areas 04b and 04c, respectively.

The total breakout area as a sum of breakout areas 04a, 04b and 04c, will typically be equal to or less than a prior art breakout area, such as that shown in FIG. 2 for a single prior art programmable logic device. Typically, the sum of the breakout areas of the programmable logic device 02 and outrigger devices 05a and 05b is expected to be less than the total prior art breakout area for one programmable logic device as shown in FIG. 2, although, in a worst case scenario, the total breakout area for one embodiment of the invention may equal that of a prior art programmable logic device.

In operation, signals having a slack value that exceeds a specified threshold may be considered for exporting to an outrigger device for transmission from exported pins formed thereon. Thus, in operation, programmable logic device 02 transmits a first group of signals from a set of local pins thereon programmable logic device 02 and further transmits a second group of signals to outrigger devices 05a and 05b for transmission from specified exported pins formed thereon. Details regarding transmission of signals to exported pins will be provided below. Each of the signals of the second group of signals has a slack value that exceeds a specified threshold.

Figure 4:
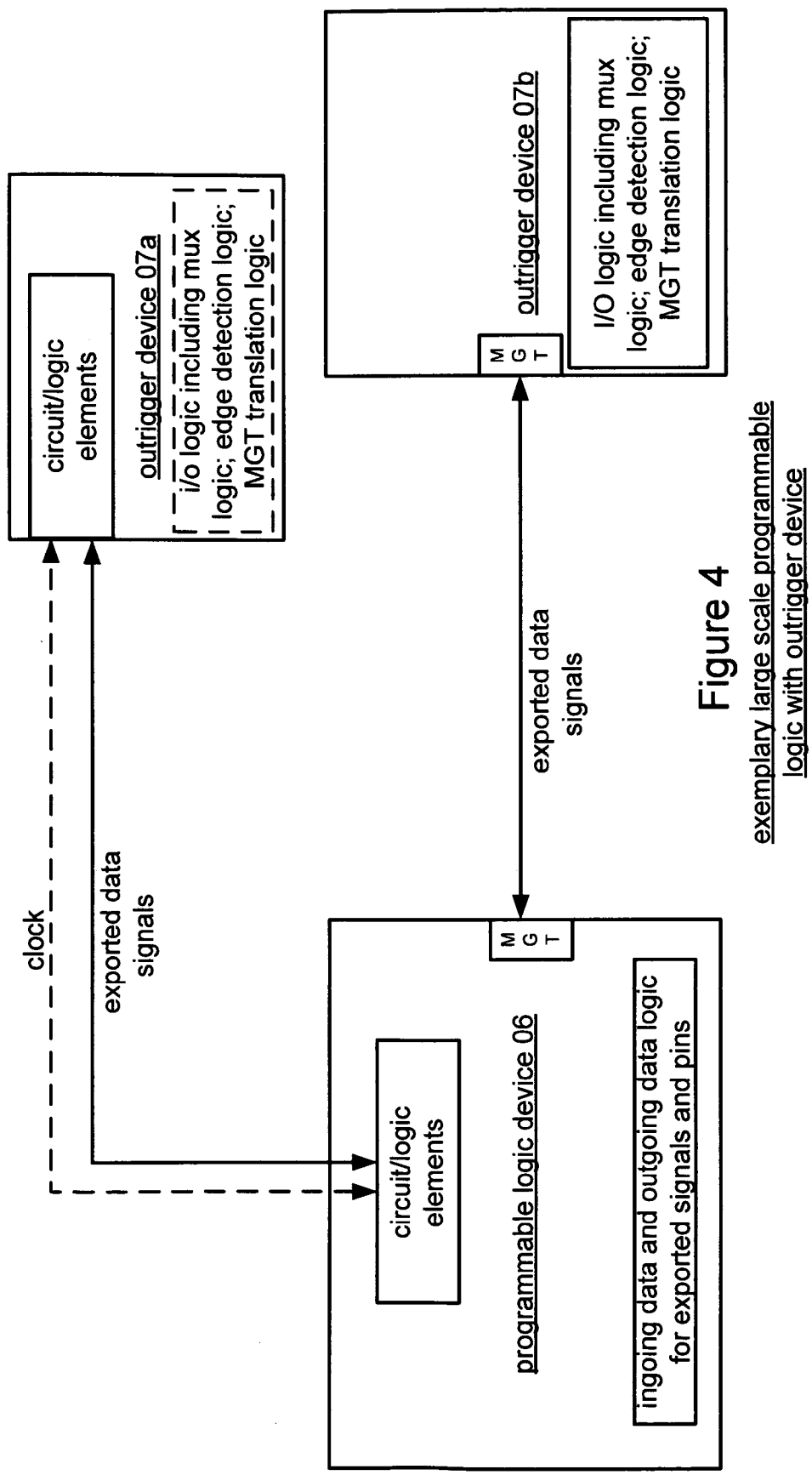
FIG. 4 is a functional block diagram of exemplary large scale programmable logic with an outrigger device formed according to one embodiment of the present invention.

FIG. 4 is a functional block diagram of an exemplary large scale programmable logic with an outrigger device formed according to one embodiment of the present invention. As may be seen, a programmable logic device 06 is operatively coupled to exchange signals with outrigger devices 07a and 07b. Generally, according to the embodiments of the present invention, outrigger devices specifically do not contain substantial operational logic and are functionally limited to input/output-related logic to perform data signaling, data routing, and data transmission.

The outrigger devices specifically do not contain logic for processing data beyond what is necessary for data transmission purposes including data addressing and routing. Thus, as may be seen, outrigger device 07a and 07b include input/output logic that further includes MUX logic, edge detection logic, and in some embodiments, multi-gigabit transceiver translation logic. If the outrigger device communicates over a traditional parallel line bus, the logic might include logic for receiving and processing the data according to specific implementation. As may further be seen in FIG. 4, programmable logic device 06 may optionally produce a clock to an outrigger device such as device 07a that corresponds with the exported data signals. Conversely, an outrigger device may also provide a clock, for example, a recovered clock from ingoing data and may provide the recovered clock to the programmable logic device 06.

For example, in one embodiment of the present invention, each signal received from programmable logic device 06 includes an address to specify an output pin (an exported pin from programmable logic device 06). In an alternate embodiment, data is continually received for all pins in a specified sequence thereby removing a need for pin addressing information. A cost of this approach, of course, is that data is transmitted whether a change in logic state has occurred or not. Thus, as may be seen, the input/output logic of outrigger device 07a or 7b is a function of specific implementation and communication schemes though it is specifically limited to data signaling, data routing, and data transmission logic.

Continuing to refer to FIG. 4, programmable logic device 06 includes ingoing data and outgoing data logic for exported signals and pins. In the prior art, all ingoing and outgoing signals were transmitted or received through local pins formed as a part of the programmable logic device. Here, however, because some pins are exported to outrigger devices 07a and 07b, some signals must also be exported. Accordingly, programmable logic device 06 includes logic for processing signals that would have otherwise gone to a local pin to transmit the signals to outrigger devices 07a and 07b.

As was described before, in one embodiment of the invention, the outgoing data logic adds a specific pin address that is transmitted in connection with a particular data signal to outrigger devices 07a and 07b to inform outrigger devices 07a and 07b of a pin to which the corresponding signal is to be produced. In an alternate embodiment of the invention, outgoing data logic of programmable logic device 06 transmits all exported signals to outrigger devices 07a and 07b regardless of whether any particular signal has had a change in logic state.

With respect to ingoing signals, programmable logic device 06 must be able to receive ingoing signals from outrigger devices 07a and 07b and process those signals as if received from a local pin. For example, programmable logic device 06 may well include a specific logic element, such as a transistor, having an input that, rather than being received from a local pin, is received as a signal from outrigger devices 07a and 07b. Accordingly, ingoing data logic of programmable logic device 06 must produce the ingoing signal to the specified pin of the logic element, here the transistor. Thus, for the operational or processing logic of programmable logic device 06, ingoing data logic must process the data to make the manner of input transparent to the specified circuit or logic element. Although the discussion treats signals as single bit values, the signals may include groups of bits or symbols having multiple bits defining the values therefor to improve transmission, network and bus efficiencies.

Figure 5:
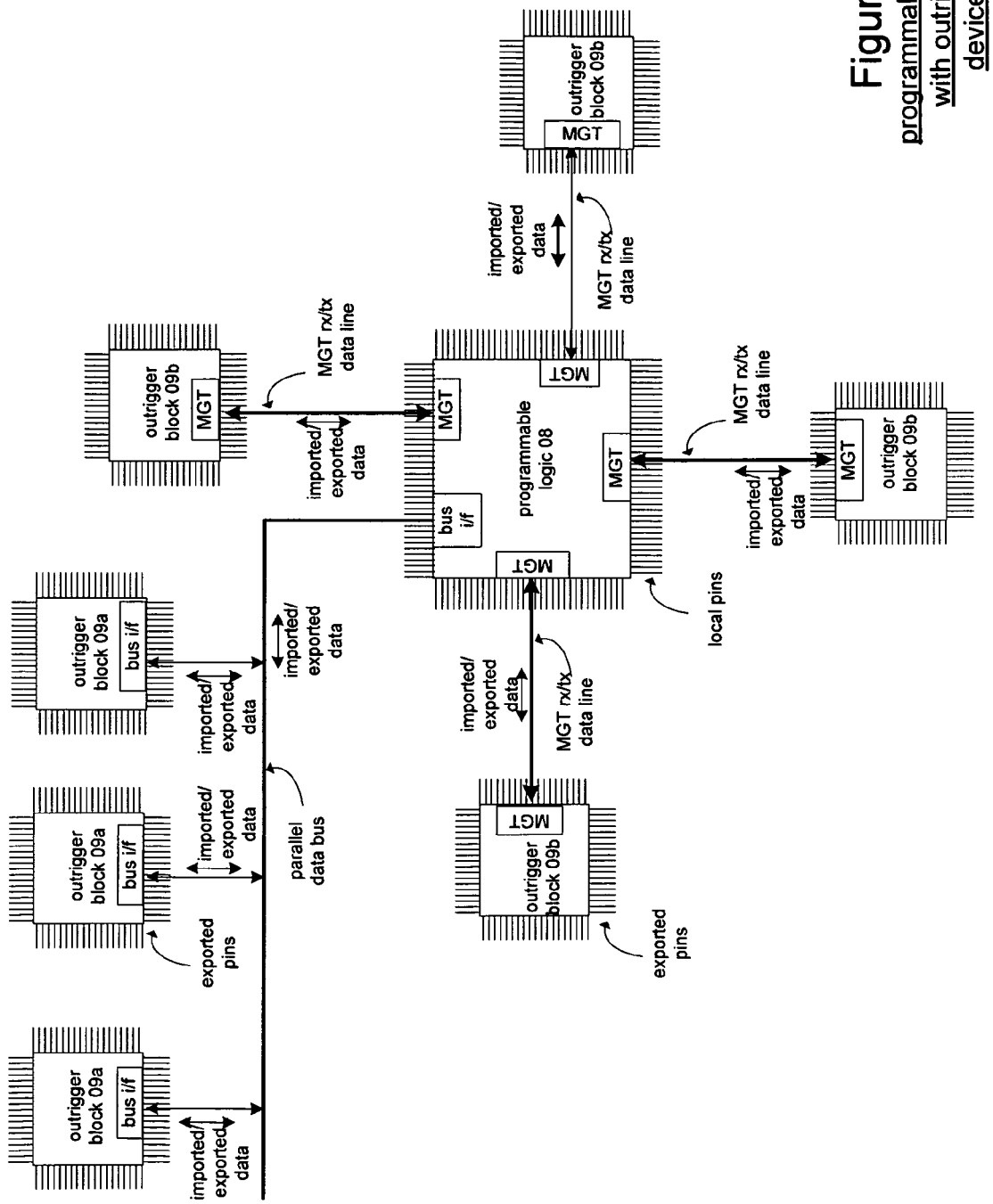
FIG. 5 is a functional block diagram of programmable logic with outrigger devices formed according to one embodiment of the present invention.

FIG. 5 is a functional block diagram of programmable logic with outrigger devices formed according to one embodiment of the present invention. As may be seen, programmable logic 08 is operatively coupled to communicate with a plurality of outrigger blocks 09a over a parallel data bus and with a plurality of outrigger blocks 09b over a multi-gigabit transceiver data line. Programmable logic 08 includes a corresponding port for each of the data lines or buses over which it communicates.

More specifically, as may be seen, programmable logic 08 communicates with three outrigger blocks 09a over one parallel data bus and thus includes only one parallel data bus interface. However, each outrigger block 09b communicates with programmable logic 08 over a dedicated multi-gigabit transceiver data line. Thus, programmable logic 08 includes a multi-gigabit transceiver data port for each outrigger block 09b with which it is operatively coupled to communicate.

As may be seen, each of the outrigger blocks 09a and 09b include a plurality of exported pins, while programmable logic 08 includes a plurality of local pins. As has been described previously, the exported pins of the outrigger blocks 09a and 09b are for transmitting and receiving exported signals that, in the prior art, would have been transmitted and received from local pins of the programmable logic. The form of the pins of FIG. 5 is exemplary only. All packaging technologies are specifically included in the embodiments of the invention.

One significant advantage provided by the embodiments of the present invention is that the breakout area of the large scale logic device is substantially reduced. Typically, however, a practical limit exists for a breakout area size that is required to support a corresponding number of pins of the large scale logic. One corresponding benefit, therefore, is that a greater number of logic elements may be formed within large scale logic devices because a portion of the required number of pins according to Rent's Rule may be exported to the outrigger devices according to the embodiments of the present invention.

For example, if a circuit board size limits a breakout area size to support connections for 2000 pins, the prior art designs would limit the number of elements within the large scale logic to a number that can be supported by only 2000 pins. With the embodiments of the present invention, however, pins and signals may be exported to outrigger devices on the same or different circuit boards to facilitate large scale logic requiring 3000 pins (for example). The connection to the outrigger device adds some connections to the programmable logic device, but a net saving of pins is achieved when the number of exported pins exceeds the number of pins required to communicate with the outrigger device. Further, the connection the outrigger device may be very regular, simplifying the layout of signals.

Thus, in one embodiment, the large scale logic may have a number of pins in the range of 1000 to 1500 pins while the outrigger device(s) have a number of pins in the range of 500 to 1500 pins for a total possible pin count of 3000 pins. If 2000 pins is a practical limit, for example, the embodiments of the present invention allow for designs that require a total number of pins that exceed 2000 pins. Generally, it should be understood that these numbers represent but one embodiment and are exemplary. These exemplary numbers represent, however, that limits on scaling that result from pin connectivity limits may be extended upwardly.

As an additional aspect of the present invention, the embodiment of FIG. 5 suggests that outgoing and ingoing data may be exported according to slack values, or more generally, timing budgets, for the specific signals. For example, a first group of data signals having transmission timing budgets (slack values) less than a first specified threshold are transmitted and received directly on local pins of programmable logic 08. A second group of signals having timing budget values (slack values) that exceed the first threshold but that are less than a second threshold are produced over one of the plurality of multi-gigabit transceiver data lines to corresponding outrigger blocks 09b. A third group of signals having transmission timing budget values that exceed the second threshold are exported to outrigger blocks 09a over the parallel data bus.

Generally, the signals that are exported to the outrigger blocks 09a are those signals that have the greatest transmission delay budget. It is presumed, for the purposes of this example, that the multi-gigabit transceiver data lines conduct data at a faster rate than the parallel data bus. Such arrangement, however, is exemplary of one embodiment of the present invention. Generally, the embodiment of the invention includes any embodiment in which the type of signals and pins that are exported are a function of expected export delays in relation to slack values (transmission delay budgets).

One significant aspect of the embodiment of FIG. 5 is that a significantly larger number of pins may be used for logic formed within programmable logic 08 in relation to prior art designs where the breakout area and connectivity issues tend to place a practical limit on a number of logic elements and corresponding number of pins according to Rent's Rule. As described before, Rent's Rule defines how many pins are typically required for a specified number of logic elements within a programmable logic device. Because the problem of breakout areas as described before is so significant for large scale programmable logic devices, a practical limit to the number of pins may be realized.

Accordingly, the embodiment of FIG. 5 specifically produces an ability, through the circuitry and corresponding method, for having greater numbers of pins on a printed circuit board to correspond with internal logic elements of a large scale programmable logic device. Thus, one advantage described before is the probable reduction in total breakout area. The second, and potentially larger benefit, is that practical limits on pin counts may be extended upwardly.

Figure 6:
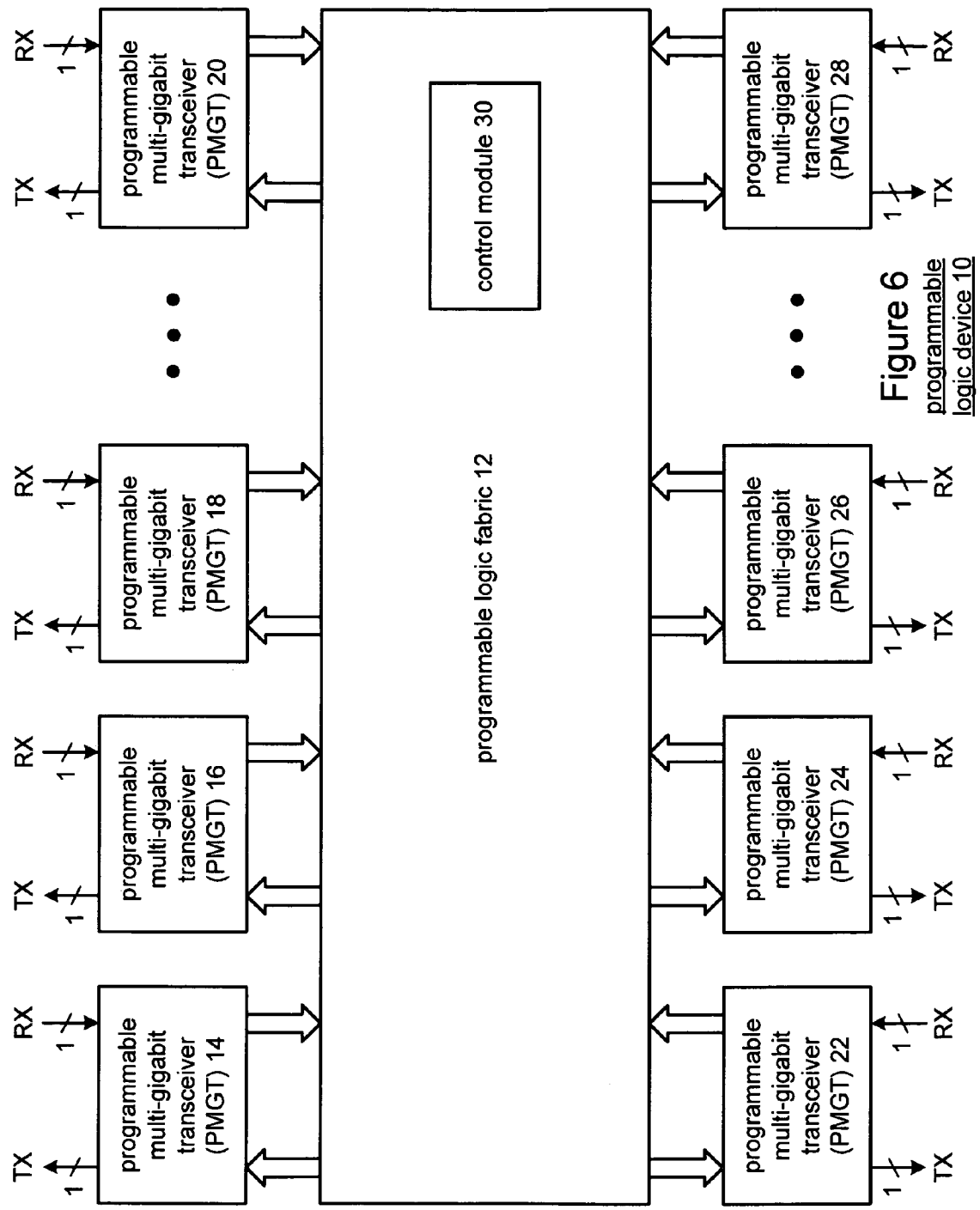
FIG. 6 is a schematic block diagram of a programmable logic device in accordance with the present invention.

FIG. 6 is a schematic block diagram of a programmable logic device 10 that includes programmable logic fabric 12, a plurality of programmable multi-gigabit transceivers (PMGT) 14-28 and a control module 30. Programmable logic device 10 may be a programmable logic array device, an erasable programmable logic device, and/or a field programmable gate array (FPGA). When programmable logic device 10 is a field programmable gate array (FPGA), programmable logic fabric 12 may be implemented as a symmetric array configuration, a row-based configuration, a sea-of-gates configuration, and/or a hierarchical programmable logic device configuration. Programmable logic fabric 12 may further include at least one dedicated fixed processor, such as a microprocessor core, to further facilitate the programmable flexibility offered by programmable logic device 10.

Control module 30 may be contained within programmable logic fabric 12 or it may be a separate module. In either implementation, control module 30 generates the control signals to program each of the transmit and receive sections of the programmable multi-gigabit transceivers 14-28. In general, each of the programmable multi-gigabit transceivers 14-28 performs a serial-to-parallel conversion on received data and performs a parallel-to-serial conversion on transmit data. The parallel data may be 8-bits, 16-bits, 32-bits, 64-bits, etc., wide.

Typically, the serial data will be a 1-bit stream of data that may be a binary level signal, multi-level signal, etc. Further, two or more programmable multi-gigabit transceivers may be bonded together to provide greater transmitting speeds. For example, if multi-gigabit transceivers 14, 16 and 18 are transceiving data at 3.125 gigabits per second, the transceivers 14-18 may be bonded together such that the effective serial rate is 3 times 3.125 gigabits per second.

Each of the programmable multi-gigabit transceivers 14-28 may be individually programmed to conform to separate standards. In addition, the transmit path and receive path of each multi-gigabit transceiver 14-28 may be separately programmed such that the transmit path of a transceiver is supporting one standard, while the receive path of the same transceiver is supporting a different standard. Further, the serial rates of the transmit path and receive path may be programmed from 1 gigabit per second to tens of gigabits per second. The size of the parallel data in the transmit and receive sections, or paths, is also programmable and may vary from 8-bits, 16-bits, 32-bits, 64-bits, etc.

Figure 7:
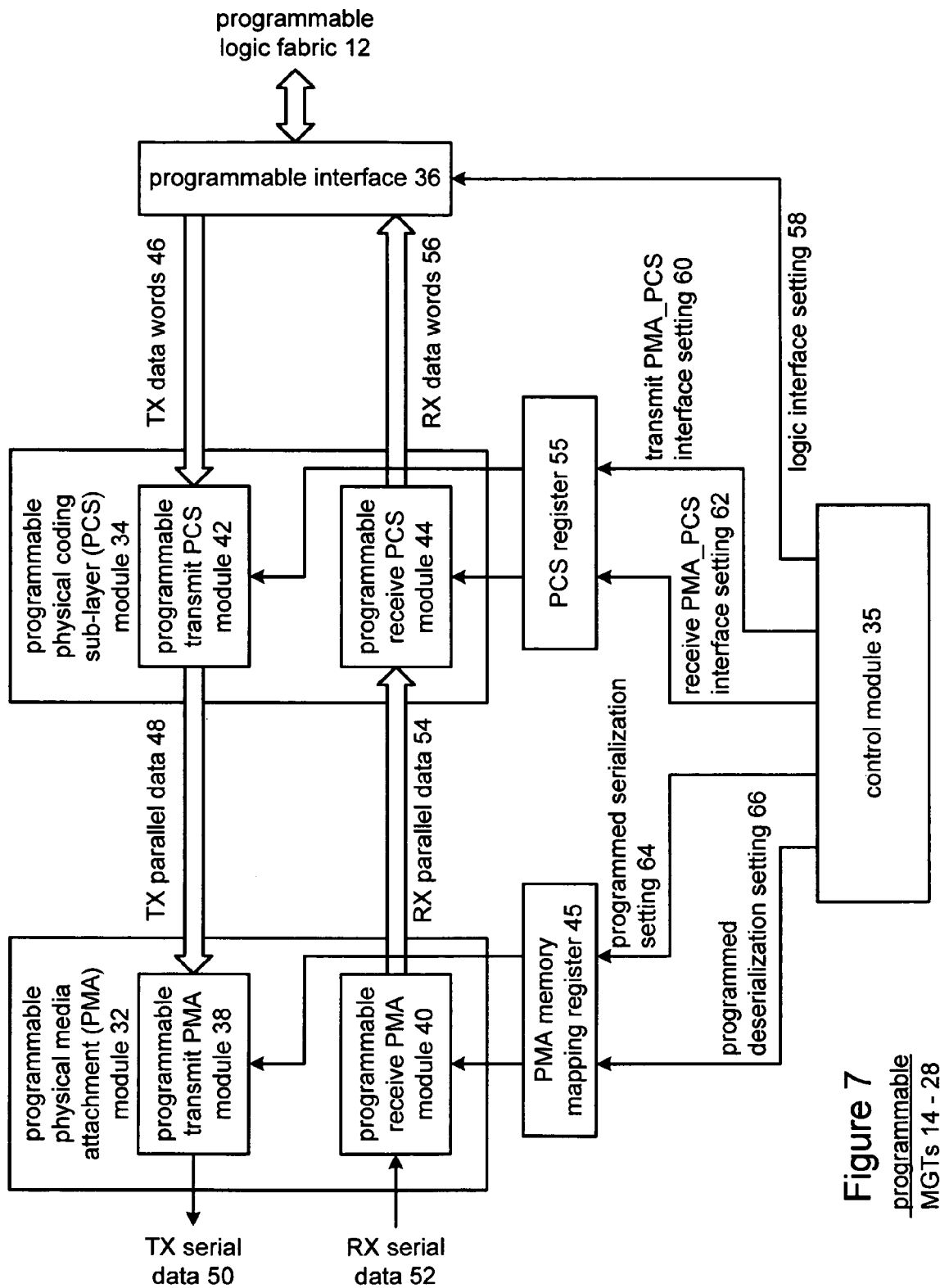
FIG. 7 is a schematic block diagram of a programmable multi-gigabit transceiver in accordance with the present invention.

FIG. 7 is a schematic block diagram of one embodiment of a representative one of the programmable multi-gigabit transceivers 14-28. As shown, the programmable multi-gigabit transceiver 14-28 includes a programmable physical media attachment (PMA) module 32, a programmable physical coding sub-layer (PCS) module 34, a programmable interface 36, a control module 35, a PMA memory mapping register 45 and a PCS register 55. Control module 35, based on the desired mode of operation for the individual programmable multi-gigabit transceivers 14-28, generates a programmed deserialization setting 66, a programmed serialization setting 64, a receive PMA_PCS interface setting 62, a transmit PMA_PCS interface setting 60, and a logic interface setting 58. Control module 35 may be a separate device within each of the multi-gigabit transceivers and/or included within control module 30. In either embodiment of the PMGT control module 35, the programmable logic device control module 30 determines the corresponding overall desired operating conditions for the programmable logic device 10 and provides the corresponding operating parameters for a given multi-gigabit transceiver to its control module 35, which generates the settings 58-66.

Programmable PMA module 32 includes a programmable transmit PMA module 38 and a programmable receive PMA module 40. Programmable transmit PMA module 38 is operably coupled to convert transmit parallel data 48 into transmit serial data 50 in accordance with programmed serialization setting 64. Programmed serialization setting 64 indicates the desired rate of transmit serial data 50, the desired rate of transmit parallel data 48, and the data width of transmit parallel data 48. Programmable receive PMA module 40 is operably coupled to convert receive serial data 52 into receive parallel data 54 based on programmed deserialization setting 66. Programmed deserialization setting 66 indicates the rate of receive serial data 52, the desired rate of receive parallel data 54, and the data width of receive parallel data 54. The PMA memory mapping register 45 may store the programmed serialization setting 64 and the programmed deserialization setting 66.

Programmable physical coding sub-layer (PCS) module 34 includes a programmable transmit PCS module 42 and a programmable receive PCS module 44. Programmable transmit PCS module 42 receives transmit data words 46 from programmable logic fabric 12 via programmable interface 36 and converts them into transmit parallel data 48 in accordance with transmit PMA_PCS interface setting 60. Transmit PMA_PCS interface setting 60 indicates the rate of the transmit data words 46, the size of the transmit data words (e.g., 1 byte, 2 bytes, 3 bytes, 4 bytes, etc.) and the corresponding transmission rate of the transmit parallel data 48. Programmable receive PCS module 44, converts the received parallel data 54 into received data words 56 in accordance with receive PMA_PCS interface setting 62. The received PMA_PCS interface setting 62 indicates the rate at which the received parallel data 54 will be received, the width of the parallel data 54, the transmit rate of the received data words 56, and the word size of the received data words 56.

Control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the received data words 56 are provided to the programmable logic fabric 12.

As one of average skill in the art will appreciate, each of the modules within programmable PMA module 32 and programmable PCS module 34 may be individually programmed to support a desired data transfer rate. The data transfer rate may be in accordance with a particular standard such that the receive path, i.e., the programmable receive PMA module 40 and the programmable receive PCS module 44, may be programmed in accordance with one standard, while the transmit path, i.e., the programmable transmit PCS module 42 and the programmable transmit PMA module 38, may be programmed in accordance with another standard.

Figure 8:
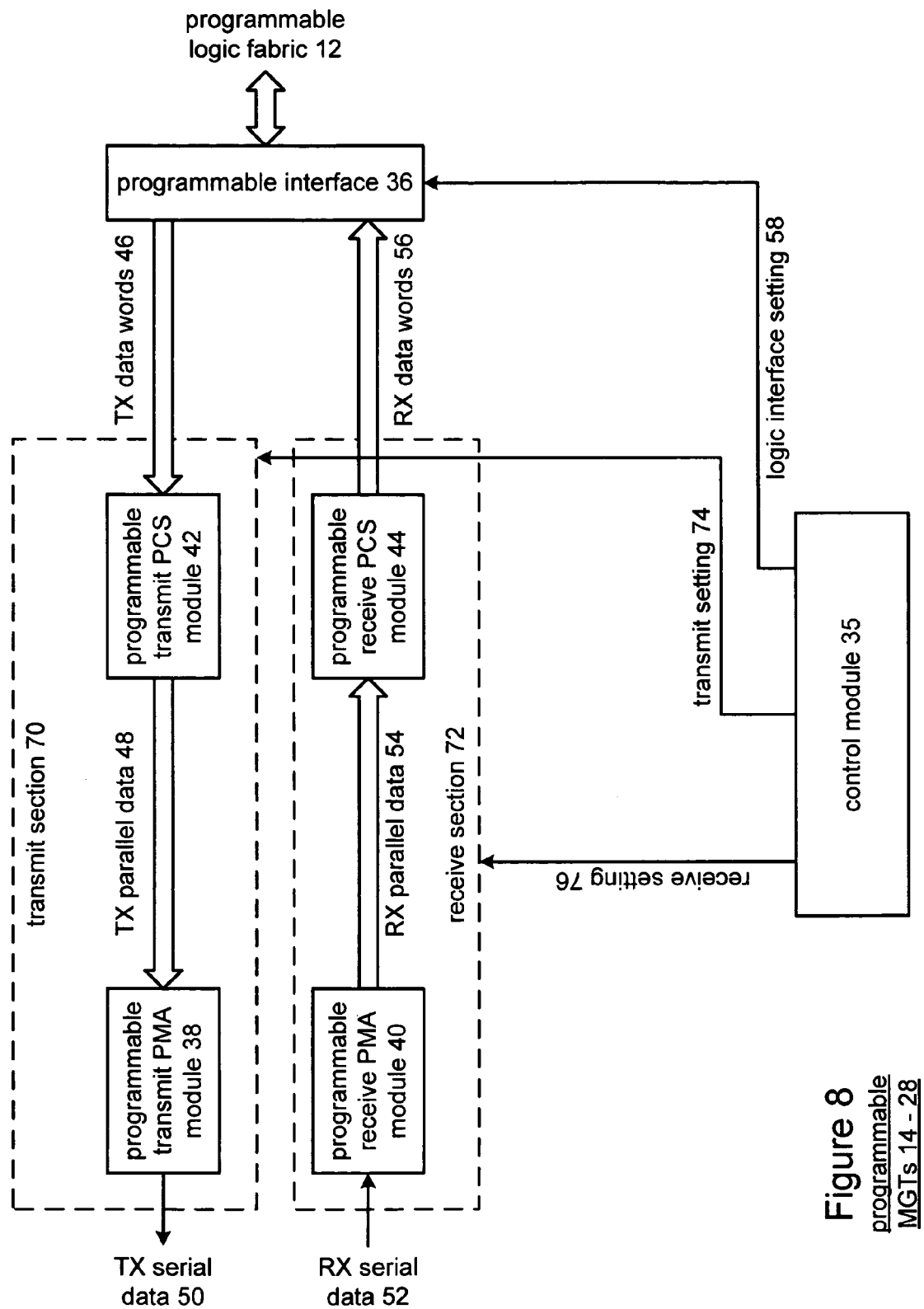
FIG. 8 is a schematic block diagram of an alternate embodiment of a programmable multi-gigabit transceiver in accordance with the present invention.

FIG. 8 illustrates an alternate schematic block diagram of a representative one of the programmable multi-gigabit transceivers 14-28. In this embodiment, the programmable multi-gigabit transceiver 14-28 includes a transmit section 70, a receive section 72, control module 35 and programmable interface 36. Transmit section 70 includes programmable transmit PMA module 38 and programmable transmit PCS module 42. Receive section 72 includes programmable receive PMA module 40 and programmable receive PCS module 44.

In this embodiment, control module 35 separately programs the transmit section and the receive section via transmit setting 74 and receive setting 76, respectively. Control module 35 also programs programmable interface 36 via logic interface setting 58. Accordingly, control module 35 may program the receive section 72 to function in accordance with one standard, while programming the transmit section 70 in accordance with another standard. Further, logic interface setting 58 may indicate that the transmit data words 46 are received from programmable logic fabric 12 at a different rate than the received data words 56 are provided to the programmable logic fabric 12. As one of average skill in the art will appreciate, programmable interface 36 may include a transmit buffer and a receive buffer, and/or an elastic store buffer to facilitate the providing and receiving of the data words 46 and 56 to and from programmable logic fabric 12.

Figure 9:
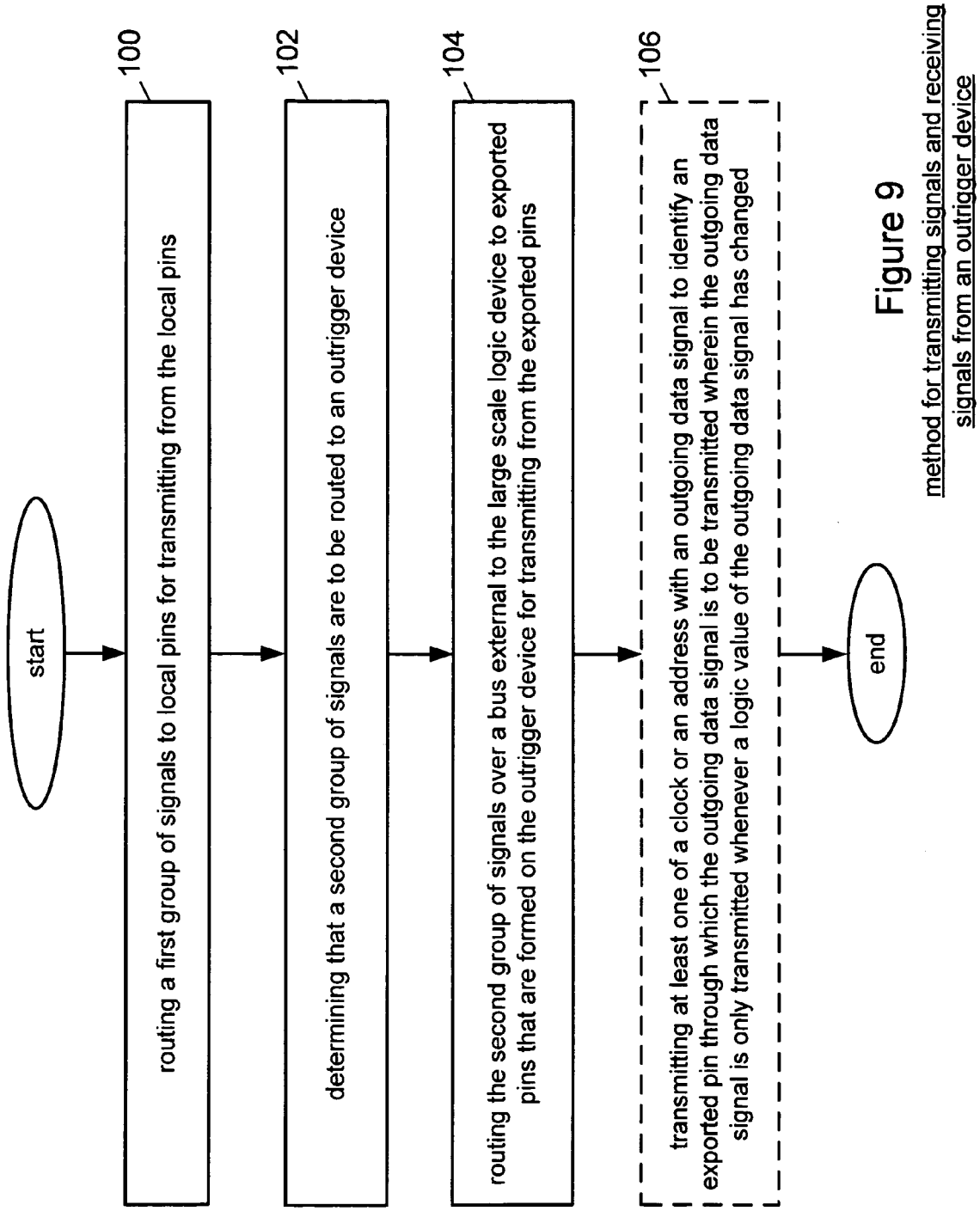
FIG. 9 is a flowchart that illustrates a method for transmitting signals to, and receiving signals from, an outrigger device according to one embodiment of the present invention.

FIG. 9 is a flowchart that illustrates a method for transmitting signals to, and receiving signals from, an outrigger device according to one embodiment of the present invention. The embodiment of the invention of FIG. 9 includes initially routing a first group of signals to local pins for transmitting from the local pins (step 100). The embodiment of the present invention further includes determining that a second group of signals are to be routed to an outrigger device (step 102).

After the determining step, the embodiment of the present invention includes routing the second group of signals over a bus external to the large scale logic device to exported pins that are formed on the outrigger device for transmitting from the exported pins (step 104). The bus, in one embodiment of the invention, may be a parallel data bus, while, in an alternate embodiment of the invention, the bus may be a multi-gigabit transceiver data line.

Additionally, the embodiment of FIG. 9 includes optionally transmitting one of a clock or an address with an outgoing data signal to identify an exported pin through which the outgoing data signal is to be transmitted wherein the outgoing data signal is only transmitted whenever a logic value of the outgoing data signal has changed (step 106). Alternatively, because an address can be so much larger in size than the specific signal, especially where the signal merely reflects a logic state such as a logic 0 or a logic 1, the embodiment of the present invention may include merely transmitting all exported signals on a repetitive basis without addresses wherein the sequential order of the signals relate to specified exported pins of the outrigger device. The embodiment of the invention further includes optionally receiving a recovered clock from an outrigger device that corresponds to in-going data.

Figure 10:
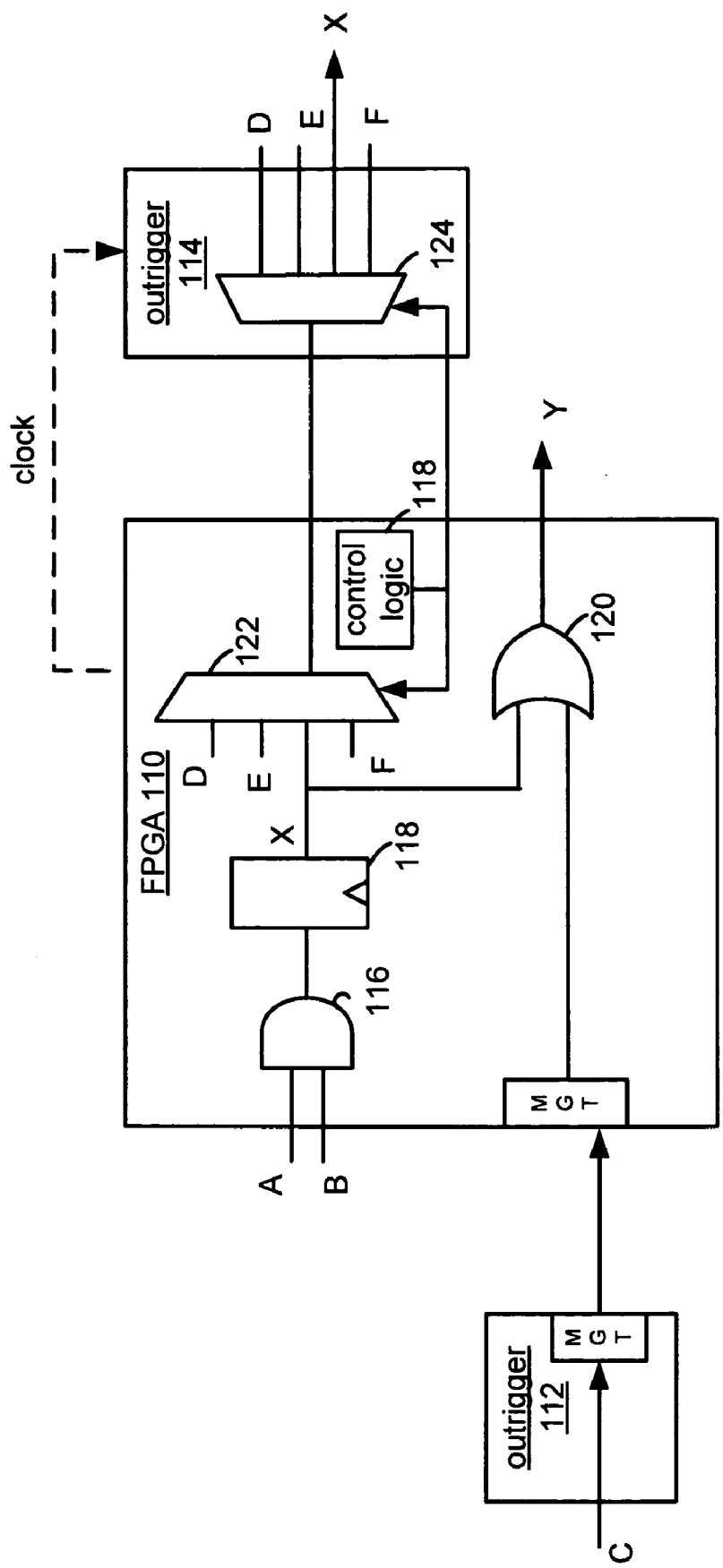
FIG. 10 is a functional schematic diagram that illustrates one aspect of the embodiments of the invention.

FIG. 10 is a functional schematic diagram that illustrates one aspect of the embodiments of the invention. Referring now to FIG. 10, an FPGA 110 is operably coupled to receive inputs A and B from a pin or ball of a ball-grid array and an input C from an outrigger 112 by way of an MGT serial link. In the example, input C is not as time critical as inputs A and B. FPGA 110 further produces a plurality of outputs D, E, F, X and Y. Outputs X and Y are functions of the representative FPGA logic elements comprising AND gate 116, flip-flop 118 and OR gate 120. Further, output Y is produced directly from output pin or ball of FPGA 110 while outputs D, E, F and X are exported to outrigger 114.

Within FPGA 110 and outrigger 114, there exists a multiplexor 122 and a de-multiplexor 124 (collectively, "multiplex devices"), respectively, for facilitating the exporting of a plurality of logic element outputs to outrigger 114. Further, a control logic block 118 is operable to produce control signals to synchronize the multiplex devices so that, for example, output X from flip-flop 118 is produced to a correct output pin of outrigger 114.

One important aspect of the functional schematic diagram of FIG. 10 is the functional topology of the circuitry. Specifically, all operational logic that is for manipulating logic data in collocated in one device, namely, FPGA 110. Only data communication and distribution logic is formed within outrigger 114 (and outrigger 112). Thus, in terms of functional partitioning, outrigger devices 112 and 114 provide greater input/output capacity for a single device or logic group (here, FPGA 110). This is to be contrasted to the prior art wherein operational logic and its associated input/output logic is divided amongst a plurality of devices on a circuit board.

The embodiments of the invention disclosed herein are susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A method in a large scale logic device for communicating with external devices, comprising:
    communicating with an external device through a plurality of pins of the large scale logic device for all signals having a slack value that is less than or equal to a specified value;

for a set of signals having a slack value that exceeds the specified value, transmitting said set of signals over a digital communication channel to an outrigger device; and transmitting said set of signals from said outrigger device to an external device with an address to identify an exported pin through which the set of signals is to be transmitted.

2. The method of claim 1 wherein said digital communication channel comprises a serial-digital multi-gigabit transceiver.

3. The method of claim 1 wherein said digital communication channel comprises a multi-line data bus.

4. The method of claim 1 wherein said digital communication channel comprises a serial-digital multi-gigabit transceiver and a multi-line data bus.

5. A method for transmitting outgoing data signals from a large scale logic device, comprising:

routing a first group of signals to local pins for transmitting from the local pins;

determining that a second group of signals are to be routed to an outrigger device;

routing the second group of signals to exported pins that are formed on the outrigger device for transmitting from the exported pins;

transmitting an address with an outgoing data signal to identify an exported pin through which the outgoing data signal is to be transmitted; and wherein routing the second group of signals comprises transmitting the second group of signals over a bus external to the large scale logic device.

6. The method of claim 5 wherein all logic of the outrigger device consists of one of data communication and data routing logic.

7. The method of claim 5 wherein the outgoing data signal is only transmitted whenever a logic value of the outgoing data signal has changed.

8. The method of claim 5 further comprising transmitting at least one data signal for every exported pin on a repetitive basis even when a logic value of the at least one data signal has not changed.

* * * * *